(12) United States Patent
Kaindl et al.

(10) Patent No.: US 11,851,013 B2
(45) Date of Patent: Dec. 26, 2023

(54) METHOD FOR OPERATING AN ELECTRICALLY DRIVABLE MOTOR VEHICLE AND A DEVICE THEREFOR

(71) Applicant: AUDI AG, Ingolstadt (DE)

(72) Inventors: Sebastian Kaindl, Ingolstadt (DE); Peter Schiller, Langquaid (DE)

(73) Assignee: AUDI AG, Ingolstadt (DE)

( * ) Notice: Subject to any disclaimer, the term of this patent is extended or adjusted under 35 U.S.C. 154(b) by 468 days.

(21) Appl. No.: 16/937,698

(22) Filed: Jul. 24, 2020

(65) Prior Publication Data
US 2021/0039576 A1 Feb. 11, 2021

(30) Foreign Application Priority Data

Aug. 5, 2019 (DE) ...................... 10 2019 211 727.9

(51) Int. Cl.
*G01R 31/00* (2006.01)
*B60R 21/017* (2006.01)
(Continued)

(52) U.S. Cl.
CPC .......... *B60R 21/017* (2013.01); *B60R 16/023* (2013.01); *B60R 16/033* (2013.01);
(Continued)

(58) Field of Classification Search
CPC .. G01R 31/006; G01R 15/146; G01R 15/202; B60R 21/017; B60R 16/023; B60R 16/033
See application file for complete search history.

(56) References Cited

U.S. PATENT DOCUMENTS 6,124,784 A * 9/2000 Wells ...................... B60R 21/01
340/438
6,456,915 B1 * 9/2002 Fendt .................... B60R 21/017
180/274
(Continued)

FOREIGN PATENT DOCUMENTS

CN 101401272 A 4/2009
DE 10 2009 020 178 A1 11/2010
(Continued)

OTHER PUBLICATIONS

Examination Report dated May 13, 2020 in corresponding German application No. 10 2019 211 727.9; 22 pages including Machine-generated English-language translation.
(Continued)

*Primary Examiner* — Patrick Assouad
*Assistant Examiner* — Demetrius R Pretlow
(74) *Attorney, Agent, or Firm* — Maier & Maier, PLLC (57) ABSTRACT

The invention relates to a method for operating an electrically drivable motor vehicle. A triggering signal for a pyrotechnic separating element is determined and output with application of a triggering criterion to a received respective electrical signal and/or at least three detected measured values by a microcontroller. A detection unit, two interfaces, and the separating element are electrically coupled to one another centrally via the microcontroller. Depending on the received triggering signal, at least one electrical connecting element is disconnected by the separating element.

14 Claims, 2 Drawing Sheets

(51) Int. Cl.
*B60R 16/023* (2006.01)
*G01R 15/14* (2006.01)
*G01R 15/20* (2006.01)
*B60R 16/033* (2006.01)

(52) U.S. Cl.
CPC ......... *G01R 15/146* (2013.01); *G01R 15/202* (2013.01); *G01R 31/006* (2013.01)

(56) References Cited

U.S. PATENT DOCUMENTS

| | | | | |
|---|---|---|---|---|
| 7,107,133 B2 * | 9/2006 | Fisher | ................ | B60R 21/0173 |
| | | | | 701/45 |
| 2005/0098989 A1 * | 5/2005 | Brown, Jr. | ............ | B60R 21/017 |
| | | | | 280/735 |
| 2005/0225924 A1 * | 10/2005 | Sibrai | ................ | B60R 21/0173 |
| | | | | 361/247 |
| 2005/0267662 A1 * | 12/2005 | Fisher | ................ | B60R 21/0173 |
| | | | | 701/45 |
| 2008/0125940 A1 * | 5/2008 | Breed | ................... | B60R 21/013 |
| | | | | 701/45 |
| 2008/0151454 A1 * | 6/2008 | Uhl | ........................ | B60R 21/01 |
| | | | | 361/87 |
| 2011/0210605 A1 * | 9/2011 | Duan | ................... | H02J 7/0031 |
| | | | | 307/9.1 |
| 2013/0062866 A1 * | 3/2013 | Breed | .................... | B60R 21/30 |
| | | | | 280/731 |
| 2013/0229742 A1 * | 9/2013 | Auguet | ................ | B60L 3/0046 |
| | | | | 361/114 |
| 2015/0002965 A1 * | 1/2015 | Hayashi | ............. | H01L 27/0266 |
| | | | | 361/56 |
| 2015/0224950 A1 * | 8/2015 | Darraba | ................ | B60R 21/017 |
| | | | | 701/47 |
| 2017/0106825 A1 * | 4/2017 | Jousse | .................. | B60R 21/017 |
| 2017/0334087 A1 * | 11/2017 | Gass | .................... | G05B 19/406 |
| 2018/0154776 A1 * | 6/2018 | Gardien | ................ | G01R 31/52 |
| 2020/0307481 A1 * | 10/2020 | Yezersky | ............. | B60R 21/013 |
| 2022/0115878 A1 * | 4/2022 | Khozikov | ............... | B60L 58/18 |

FOREIGN PATENT DOCUMENTS

| | | | |
|---|---|---|---|
| DE | 102009020178 | * | 11/2010 |
| DE | 10 2013 017 409 A1 | | 7/2014 |
| DE | 10 2013 209 835 A1 | | 11/2014 |
| DE | 10 2016 107 707 B3 | | 7/2017 |
| DE | 102016107707 B3 | * | 7/2017 |
| DE | 10 2016 213 072 A1 | | 1/2018 |
| DE | 10 2017 202 538 A1 | | 8/2018 |
| WO | 2010128066 A2 | | 11/2010 |

OTHER PUBLICATIONS

Office Action dated Jun. 1, 2023, in corresponding Chinese Application No. 202010771319.X, 14 pages.

* cited by examiner

METHOD FOR OPERATING AN ELECTRICALLY DRIVABLE MOTOR VEHICLE AND A DEVICE THEREFOR

FIELD

The disclosure relates to a method for operating an electrically drivable motor vehicle. Furthermore, the disclosure relates to a device for this purpose.

BACKGROUND

To operate an electrically drivable motor vehicle, an energy accumulator is required, in particular a high-voltage energy accumulator (HV energy accumulator, wherein high voltage stands for an electric voltage of greater than 60 V). In case of a short-circuit and/or an overload, the energy accumulator can be shut down by means of a pyrotechnic separating element. For this purpose, the pyrotechnic separating element can be activated depending on the actuation of an airbag. A complex coordination of several and partly redundant functional components is necessary in this case.

DE 10 2017 202 538 A1 describes a safety device for a motor vehicle for disconnecting or interrupting an electrical connecting element. A control unit designed as an airbag controller is configured to output a triggering signal to the separating element. An evaluation unit is configured to output a further triggering signal to the separating element if a detected value exceeds a predetermined threshold value.

DE 10 2016 107 707 B3 discloses a protective device for a high-voltage power supply of a motor vehicle, comprising a busbar having a resistor between a first and a second connection and a pyrotechnic fuse, which is designed to sever the busbar in the event of a voltage drop between the first and the second connection.

Furthermore, DE 10 2013 017 409 A1 relates to a battery system for a vehicle that can be driven by an electric motor, comprising a high-voltage battery having a pyrotechnic fuse unit that is triggered in the event of a failure of at least one contactor.

SUMMARY

An object of the present invention is to provide a method and a device for an electrically drivable motor vehicle for reliable operation, in particular with regard to the triggering of the pyrotechnic separating element.

A method for operating an electrically drivable motor vehicle is provided by the invention. The electrically drivable motor vehicle can be designed as an automobile, in particular as a passenger car or as a truck, or as a passenger bus or as a motorcycle. In the method it is provided that a triggering signal is determined by means of a microcontroller using a triggering criterion on a received respective electrical signal and/or from at least three detected measured values and is output to trigger a pyrotechnic separating element if the respective electrical signal and/or at least one of the measured values meets the triggering criterion. At least one connecting element is disconnected by means of the pyrotechnic separating element by the triggering signal. The microcontroller for determining and outputting the triggering signal and a detection unit for detecting the at least three measured values are arranged within the same housing of a device and two interfaces for receiving the respective electrical signal are integrated into the housing. The housing can in particular be made dustproof and/or drip-proof.

The respective electrical signal is received by means of two interfaces integrated into the housing of the device, that is to say the respective signal can arrive via one or the other interface, so that multiple possible trigger channels are created. A first of the interfaces is designed as a high-voltage interface for an electrical energy accumulator and a second of the interfaces is designed as a low-voltage interface for at least one external control unit. In other words, the two interfaces are part of the housing of the device and are configured to detect the respective electrical signal transmitted from the electrical energy accumulator and the at least one external control unit. The first of the two interfaces is configured to receive the respective electrical signal of the electrical energy accumulator as a high-voltage interface. Furthermore, the second of the two interfaces is configured to receive the respective electrical signal of the at least one external control unit as a low voltage interface. The respective electrical signal can be, for example, a control signal of the at least one control unit and/or a high-voltage signal of the energy accumulator, which characterizes its charge level, for example.

For example, the electrical energy accumulator can be controlled by the at least one external control unit. In this case, the electrical energy accumulator can be designed in particular as a high-voltage battery (HV battery) and can be controlled by the at least one external control unit, which is designed as a battery control unit. Additionally or alternatively, the at least one external control unit can be an airbag control unit. The detection unit and the two interfaces are electrically coupled to one another centrally via the microcontroller.

Furthermore, at least three electrical measured values, which are correlated with a current through the detection unit, are detected by means of a detection unit arranged inside the housing. In other words, the detection unit is configured to measure the at least three electrical measured values. For this purpose, the detection unit can have one measuring sensor or multiple measuring sensors. The at least three measured values comprise here a measured value of a current strength as a first measured value, a measured value of a voltage as a second measured value, and a measured value of an insulation resistance as a third measured value. In other words, at least three measured variables, i.e., measured values are detected by means of the detection unit, which are related to the current flowing through the detection unit, for example, via at least one electrical connecting element. The at least three measured variables are the electrical current strength, the electrical voltage, and the insulation resistance. In particular, the detection unit can be configured to detect, i.e., to measure the at least three measured values continuously or at predetermined time intervals. The electrical current strength can be determined, for example, by means of a measured resistance and/or a measured magnetic field. The detected electrical voltage can in particular be a battery voltage output by the energy accumulator via the at least one electrical connecting element. On the basis of the detected insulation resistance, for example, an insulation state, in particular a possible insulation fault, of the electrically driven motor vehicle and its energy accumulator can be monitored, in particular recognized, wherein the at least one electrical connecting element is insulated within a high-voltage range in relation to a vehicle ground, i.e., a body of the motor vehicle.

The triggering signal for a pyrotechnic separating element is determined by applying a triggering criterion to the respective electrical signal received from at least one of the external control units and/or the at least three detected measured values by means of a microcontroller arranged inside the housing. In other words, the microcontroller is configured to juxtapose the received respective electrical signal and/or the at least three detected measured values with the triggering criterion for comparison. The microcontroller can comprise a processor unit for this purpose. The triggering criterion can be, for example, a predefined signal characteristic and/or a stored threshold value.

The invention is particularly advantageous in that the detection unit and the two interfaces are coupled to one another centrally via the microcontroller. In other words, starting from the microcontroller arranged in between, the detection unit and the two interfaces are electrically interconnected, that is to say networked, to transmit the respective electrical signal and/or the at least three detected measured values Coupled is to be understood to mean that the detection unit and the two interfaces are interconnected via the microcontroller for signaling, in particular in a wired or non-wired manner, i.e., for signal and/or data transmission.

If the received respective electrical signal and/or at least one of the detected measured values meets the triggering criterion, the triggering signal for the pyrotechnic separating element is output by means of the microcontroller. In other words, the determined triggering signal is transmitted to the pyrotechnic separating element or an ignition circuit connected upstream of it, if the received respective electrical signal and/or at least one of the detected measured values meets the triggering criterion, i.e., a predetermined necessary and/or sufficient condition. In this case, for example, features of the received respective electrical signal can correspond to features predetermined on the basis of the triggering criterion by a defined degree of correspondence. Alternatively or additionally, at least one of the detected measured values can exceed the threshold value, such as a maximum current strength.

The at least one electrical connecting element is disconnected by means of the pyrotechnic separating element due to the output triggering signal. For this purpose, the pyrotechnic separating element can comprise a propellant charge, in particular a squib, which is designed to receive the triggering signal and upon activation by means of the received triggering signal, i.e., upon ignition, to interrupt the at least one connecting element, in particular to disconnect it irreversibly. An electrical connection can be disconnected and in particular a current flow can be prevented by means of the at least one interrupted electrical connecting element, for example, a power line or a bus bar.

It is advantageous that multiple functions, in particular safety-critical functions, for operating the electrically drivable motor vehicle and in particular switching off the energy accumulator are provided by the device. All of the functional components, i.e., the two interfaces, the detection unit, and the microcontroller can be unified in the device, wherein a cumbersome, that is to say complex coordination with external functional components, which are partially formed redundantly, can be reduced. A number of functional components can thus be reduced and a communication effort between the functional components can be reduced. Furthermore, a reaction time when evaluating the respective electrical signal can and/or of the at least three measured values and a resulting activation time of the separating element are reduced. Due to the unified components, it is not necessary to maintain complex high-voltage specifications, for example, providing air and creepage distances, and/or safety specifications, for example, development and release processes to be carried out. This in particular increases safety when operating the motor vehicle.

The invention is based on the finding that various electronic components are required to safely operate electrically drivable motor vehicles and/or to safely shut down the energy accumulator designed as a high-voltage energy accumulator, which components fulfill multiple functions in this context and on which high safety requirements can be placed, in particular during a current measurement and/or during the shut down caused by the overcurrent. According to the invention, numerous components can thus be integrated into the device, which can be controlled by means of the central microcontroller. Thus, the detection unit of the device, together with the separating element, can provide a function comparable to a fuse, for example, in that the detection unit measures the current and can ignite the separating element if the triggering criterion is met, such as exceeding the threshold value.

The invention also comprises embodiments which result in additional advantages.

One embodiment provides that the respective electrical signal is received by the microcontroller and at least one of the measured values and/or the triggering signal is transmitted to the at least one external control unit and/or the separating element via a vehicle bus, in particular a CAN bus. In other words, the microcontroller sends at least one of the measured values and/or the triggering signal via the vehicle bus to the at least one external control unit and/or the separating element. Alternatively or additionally, the respective electrical signal is transmitted to the microcontroller from the at least one external control unit and/or the separating element and the microcontroller detects it. The CAN bus (Controller Area Network) is a serial bus system. Alternatively or additionally, the vehicle bus can be a vehicle bus designed as a LIN bus (Local Interconnect Network) or FlexRay or SPI (Serial Peripheral Interface) or Ethernet or in another way. This has the advantage that the respective electrical signal, at least one of the measured values, and/or the triggering signal can be transmitted reliably. Furthermore, the respective electrical signal, at least one of the measured values, and/or the triggering signal are available and/or transmittable quickly and/or with little interference due to short signal paths.

A further embodiment provides that the respective electrical signal is received from the at least one external control unit designed as a battery control unit and/or as an airbag control unit. In other words, the battery control unit and/or the airbag control unit transmits the respective electrical signal to the second of the interfaces, i.e., the low-voltage interface. The respective electrical signal can be provided to the microcontroller here, for example, in the course of a communication between the battery control unit and/or the airbag control unit and the microcontroller. It is advantageous that communication between the at least one control unit and the microcontroller can thus be simplified and robust data transmission can be implemented.

A further embodiment for this purpose provides that the respective electrical signal received from the airbag control unit is taken into consideration when monitoring an ignition line of an airbag by means of an ignition circuit simulation arranged inside the housing. In other words, the respective electrical signal of the airbag control unit is received by the microcontroller, wherein the respective electrical signal is provided for the ignition circuit simulation. This can be a simulation of the above-mentioned squib, by means of which a detection, i.e., a registration, of the electrical signal of the airbag control unit designed as an ignition signal is simulated. If the airbag control unit thus ignites the airbag by means of an airbag ignition signal, this signal can then be received at the low-voltage interface and an electrical behavior of an ignition procedure can be simulated by means of the ignition circuit simulation. This can be used to detect the airbag ignition signal and the triggering signal is then generated. For example, the ignition circuit simulation can comprise a transistor, for example, a MOSFET transistor, which is configured to simulate a switching state of the ignition line. It is advantageous that by means of the monitored ignition line, the ignition signal of the airbag control unit can be taken into consideration when the microcontroller activates the separating element.

A further embodiment provides that a predetermined limiting value and/or a stored limiting value characteristic curve is taken into consideration in a configuration of the triggering criterion, wherein the limiting value and/or the limiting value characteristic curve is predetermined by a component and/or a storage unit. In other words, the triggering criterion is defined on the basis of the limiting value and/or the limiting value characteristic curve, wherein the limiting value and/or the limiting value characteristic curves is stored in the storage unit and/or determined by the component. For example, a predetermined threshold value of one of the three measured values can be stored as a limiting value. The limiting value characteristic curve can be, for example, a dependency of two physical variables, in particular a time and one of the three measured values. For example, the limiting value characteristic curve specifies a time curve of the electrical current flowing through the detection unit. On the basis of the limiting value and/or the limiting value characteristic curve, for example, a maximum thermal load of the device can be limited. Alternatively or additionally, the limiting value and/or the limiting value characteristic curve can be permanently specified or variably changeable. In particular, the limiting value and/or the limiting value characteristic curve can be adjusted in dependence on an operating state of the device. The triggering criterion can be specified in particular by at least one physical component (hardware) and/or at least one immaterial component (software), which is stored in the storage unit, of the device. The component can be designed, for example, as a physical comparator, i.e., an electronic circuit which compares at least two digital and/or at least two analog values. The at least one immaterial component can be, for example, a program code stored in the storage unit, which is executed by the microcontroller and simulates the function of the comparator by means of the program code. This has the advantage that the device can be operated particularly safely by means of the triggering criterion. Furthermore, in particular specifications of the component and/or the storage unit can decisively influence a level of the limiting value and/or the course of the limiting value characteristic curve.

A further embodiment provides that the first measured value is determined by means of a current measuring sensor, in particular a Hall probe, and/or a current measuring resistor, in particular a shunt, wherein the current measuring sensor and/or the current measuring resistor is arranged on a bus bar. In other words, the first measured value is metrologically detected on the basis of a measurement by means of the current measuring sensor and/or the current measuring resistor. The current measuring sensor and/or the current measuring resistor are arranged, i.e., positioned, on the busbar here. The busbar can be designed, for example, as the at least one electrical connecting element and can be configured to electrically connect, i.e., electrically couple, the electrical energy accumulator to at least one consumer of the motor vehicle, for example, a drive of the motor vehicle.

The current measuring sensor can be implemented in particular as a Hall probe, wherein the current strength in the busbar can be measured utilizing a Hall effect on the basis of a magnetic field, which is generated, for example, by the current-conducting busbar. It is advantageous that the current strength can be determined without potential by means of the current measuring sensor implemented as a Hall probe, wherein the first measured value can be determined as a square wave signal and can be processed directly by the microcontroller. The current measuring resistor can in particular be designed as a shunt, which is implemented as a low-resistance electrical resistor. The electrical current flowing through the shunt can cause a voltage drop proportional to it, on the basis of which the electrical current, in particular the current strength, can be metrologically detected. It is advantageous that the first measured value is determined particularly precisely with the measurement by means of the current measuring sensor designed as a shunt.

A further embodiment provides that the triggering signal is transmitted to an ignition circuit of the separating element integrated into the housing and then the separating element is triggered by means of the ignition circuit, wherein upon triggering of the separating element, the at least one electrical connecting element is irreversibly disconnected by means of the separating element arranged on the busbar and/or via the low-voltage interface on an outside of the housing. In other words, the at least one electrical connecting element is interrupted, i.e., severed by means of the separating element, wherein the separating element is arranged on the busbar and/or via the low-voltage interface on the outside of the housing. The separating element is switched, i.e., activated, in this case by means of the ignition circuit arranged in the device when the triggering signal is detected. For example, the disconnection is carried out by means of the driving element and/or a bolt of the separating element, wherein the driving element and/or the bolt is accelerated upon an ignition of the separating element and disconnects the at least one electrical connecting element. The ignition circuit can be implemented, for example, as a transistor. This has the advantage that a particularly compact design of the device can be implemented if the separating element is arranged inside the device. Alternatively, if the separating element is arranged on the outside of the housing, the separating element can be easily accessible. Furthermore, it is advantageous that the triggering signal can be transmitted directly by the microcontroller by means of the ignition circuit arranged inside the device.

A further embodiment provides that the second measured value is detected by means of multiple respective electrical connecting elements, wherein a high voltage of the electrical energy accumulator designed as a high-voltage battery is received by means of the second measured value. In other words, the second measured value characterizes the voltage of the electrical energy accumulator, wherein this is the high voltage of the high-voltage battery. The measurement of the second measured value can be implemented, for example, by means of multiple respective electrical connecting elements connected in parallel. For example, the high voltage can be measured by means of a measuring transducer, such as a high-voltage transformer, and/or a high-voltage probe, such as a high-voltage pushbutton. A corruption of the second measured value by a line resistance, for example, can be reduced with the aid of a measurement by means of multiple respective electrical connecting elements connected in parallel, for example, multiple electrical lines (measurement channels). Alternatively or additionally, the electrical connecting elements can be implemented connected in series.

The high voltage can be measured in each case, for example, before and after, i.e., behind a relay, and as a function of a switching state of the relay. The high voltage can be measured here in the measurement after the relay if the relay is closed. Alternatively or additionally, the second measured value can comprise a voltage of at least one further component, for example, the separating element and/or a fuse.

A further embodiment provides that an insulation test of the electrical energy accumulator with respect to a vehicle body of the motor vehicle is carried out on the basis of the third measured value. In other words, the insulation resistance between the electrical energy accumulator and the vehicle body is measured to check the insulation resistance, wherein the third measured value describes a result of the insulation measurement. In this case, for example, existing insulation between the electrical energy accumulator, in particular its potentials, and the body of the motor vehicle can be checked. This has the advantage that a functionality and/or a safety of the insulation can be determined on the basis of the insulation test. Furthermore, possible insulation defects can be identified and remedied early.

A device for operating an electrically drivable motor vehicle is provided by the invention. For this purpose, the device comprises a housing having a microcontroller for determining and outputting a triggering signal for a pyrotechnic separating element, having a detection unit for detecting at least three measured values and having two integrated interfaces for receiving a respective electrical signal, wherein the detection unit and the interfaces are electrically coupled to one another centrally via the microcontroller. The device of the method is configured here to carry out the steps associated with the device of an embodiment of the above-explained method.

The invention also includes refinements of the device according to the invention, which have features as have already been described in conjunction with the refinements of the method according to the invention. For this reason, the corresponding refinements of the device according to the invention are not described again here.

The disclosure also comprises combinations of the features of the described embodiments.

BRIEF DESCRIPTION OF THE DRAWINGS

Exemplary embodiments of the invention are described hereinafter. In the figures.

DETAILED DESCRIPTION

The exemplary embodiments explained hereinafter are preferred embodiments of the invention. In the exemplary embodiments, the described components of the embodiments each represent individual features of the invention to be considered independently of one another, which each also refine the invention independently of one another. Therefore, the disclosure is intended to include combinations of the features of the embodiments other than those shown. Furthermore, the described embodiments can also be supplemented by further features of the invention that have already been described.

In the figures, the same reference numerals designate elements that have the same function.

Figure 1:
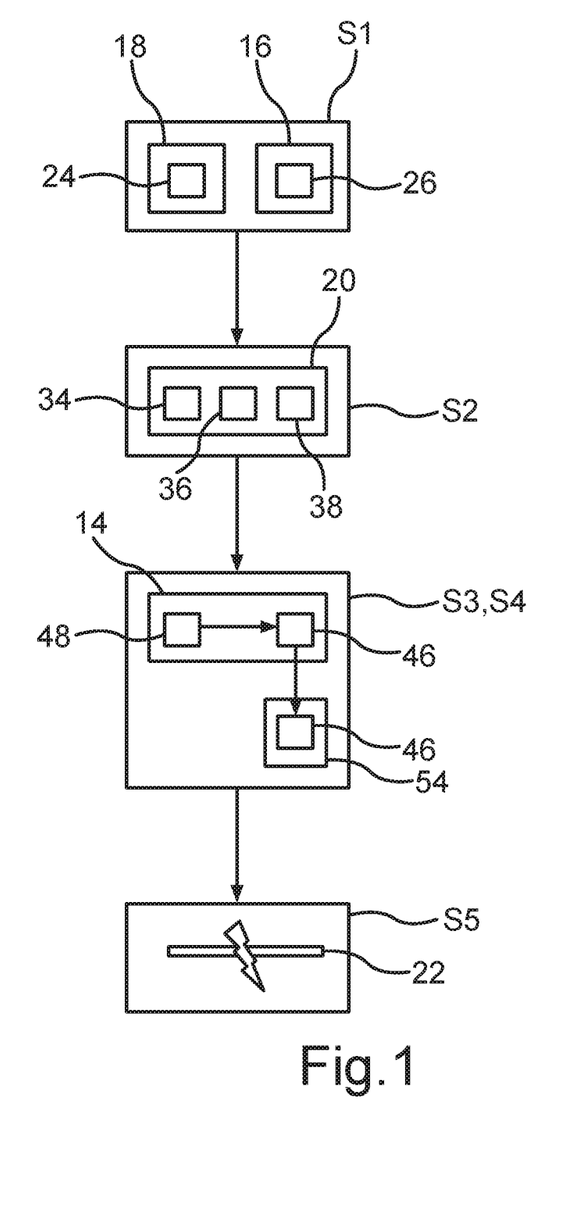
FIG. 1 schematically shows a sequence of a method for operating an electrically drivable motor vehicle.
Figure 2:
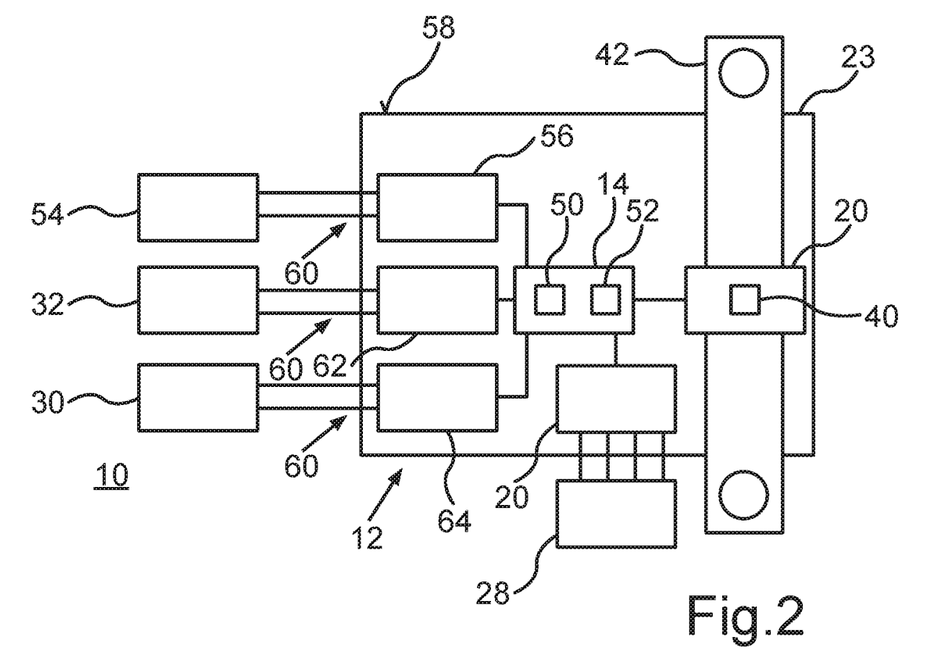
FIG. 2 schematically shows a device having a separating element arranged on an outside of the housing.
Figure 3:
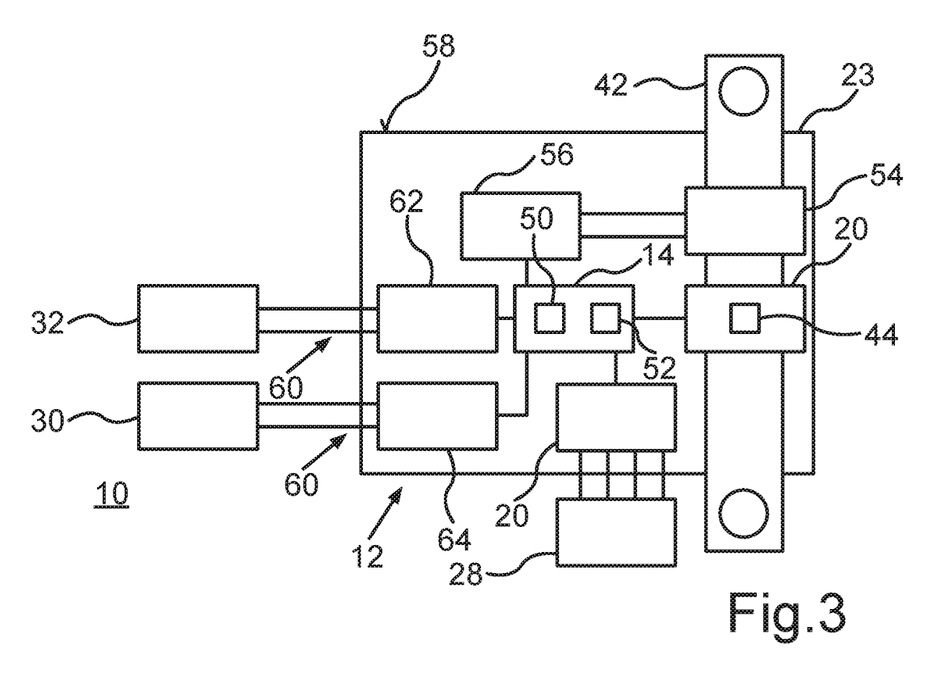
FIG. 3 schematically shows the device having the separating element arranged inside the housing on a busbar.

An exemplary embodiment of a method for operating an electrically drivable motor vehicle 10 is shown in FIG. 1, wherein the motor vehicle 10 comprises a device 12 shown in FIG. 2 and FIG. 3. The motor vehicle 10 (not shown) forms an environment for the device 12. The device 12 can comprise a microcontroller 14, two interfaces 16, 18, and a detection unit 20, wherein the detection unit 20, the interfaces 16, 18, and a separating element 54 can be electrically coupled to one another centrally via the microcontroller 14 via at least one electrical connecting element 22. The microcontroller 14 and the detection unit 20 can be arranged here inside a dustproof and/or drip-proof housing 23 of the device 12 and the two interfaces 16, 18 can be integrated into the housing 23.

In a first step S1 of the method, a respective electrical signal 24, 26 can be received by means of the two interfaces 16, 18. A first of the interfaces 16, 18 can be designed as a high-voltage interface 16 for an electrical energy accumulator 28 and a second of the interfaces 16, 18 can be designed as a low-voltage interface 18 for at least one external control unit 30, 32. The at least one external control unit 30, 32 can be designed, for example, as a battery control unit 30 and/or as an airbag control unit 32. For example, the electrical signal 24, 26 can be a control signal 24 of the at least one control unit 30, 32 or a current signal 26 characterizing a a charge level of the energy accumulator 28.

In a second step S2 of the method, at least three electrical measured values 34, 36, 38 can be detected by means of the detection unit 20, wherein the at least three electrical measured values 34, 36, 38 are correlated with a current by the detection unit 20. The at least three measured values 34, 36, 38 can comprise here a measured value of a current strength as a first measured value 34, a measured value of a voltage as a second measured value 36, and a measured value of an insulation resistance as a third measured value 38. As shown in FIG. 1, the detection unit 20 can comprise a current measuring resistor 40, in particular a shunt, which is arranged on a busbar 42 of the device 12, for detecting the first measured value 34. Alternatively, the first measured value 34, as shown in FIG. 2, can be detected with the aid of a current measuring sensor 44 are arranged on the busbar 42, in particular a Hall probe. Alternatively, the first measured value 34 can be detected with the aid of the detection unit 20 (not shown) having the current measuring resistor 40 and the current measuring sensor 44. For example, the second measured value 36 can be detected on the basis of the received current signal 26 by means of the at least one first connecting element 22, which is designed in the present case as multiple electrical connecting elements 22 connected in parallel. Alternatively or additionally, at least some of the connecting elements 22 can be connected in series. In this case, a high voltage for the electrical energy accumulator 28 designed as a high-voltage battery can be described by means of the second measured value 36. Alternatively or additionally, an electrical voltage of at least one further component, for example, the separating element 54, can be detected by means of the second measured value 36. Alternatively or additionally, the third measured value 38 can be determined on the basis of the received current signal 26, by means of which an insulation test of the electrical energy accumulator 28 with respect to a vehicle body of the motor vehicle 10 (not shown) can be carried out.

In a third step S3 of the method, a triggering signal 46 is determined with application of a triggering criterion 48 to the received respective electrical signal 24, 26 and/or one of the at least three detected measured values 34, 36, 38 by means of the microcontroller 14. When the triggering criterion 48 is specified, a limiting value, i.e., a predetermined threshold value, and/or a limiting value characteristic curve, i.e., a dependence of two physical variables, can be taken into consideration, wherein the limiting value and/or the limiting value characteristic curve is specified by a component 50 and/or a storage unit 52. For this purpose, for example, the microcontroller 14 can comprise the component 50, such as a comparator, and/or the storage unit 52, such as program code simulating a function of the comparator. If the received respective electrical signal 24, 26 and/or one of the measured values 34, 36, 38 meets the triggering criterion 48, in a fourth step S4 of the method, a triggering signal 46 for a pyrotechnic separating element 54 is output by means of the microcontroller 14, as schematically indicated in a joint illustration of steps S3 and S4 in FIG. 1.

In a subsequent fifth step S5 of the method, the at least one electrical connecting element 22, for example the busbar 42 and/or a power line, can be disconnected in dependence on the received triggering signal 46 by means of the pyrotechnic separating element 54. The triggering signal 46 can be detected by an ignition circuit 56 which switches the separating element 54, wherein the ignition circuit 56 is arranged inside the housing 23 of the device 12. The separating element 54 can be arranged on the busbar 42 (see FIG. 3) and/or via the low-voltage interface 18 on an outside 58 of the housing 23 (FIG. 2). Furthermore, the separating element 54 can comprise a propellant charge, in particular a squib, which is designed to interrupt, i.e., to short-circuit, the at least one connecting element 22, for example, to the energy accumulator 28, upon activation by means of the received triggering signal 46, i.e., upon ignition.

Furthermore, the respective electrical signal 24, 26 can be received by the microcontroller 14 at the second of the interfaces 16, 18, i.e., at the low-voltage interface 18, via a vehicle bus 60, in particular a CAN bus, and at least one of the measured values 34, 36, 38 and/or the triggering signal 46 can be transmitted to the at least one external control unit 30, 32 and/or the separating element 54. For this purpose, the electrical signal 24, 26 transmitted by the airbag control unit 32 can be taken into consideration by the microcontroller 14 when monitoring an ignition line by means of an ignition circuit simulation 62, wherein a simulated squib is simulated to detect the respective electrical signal 24, 26 designed as an ignition signal. Communication between the battery control unit 30 and the microcontroller 14 can be implemented via a communication unit 64 of the device 12.

The device 12 shown in FIG. 2 and FIG. 3 for operating an electrically drivable motor vehicle 10 can thus comprise the housing 23 having the microcontroller 14 for determining and outputting the triggering signal 46 for the pyrotechnic separating element 54, having the detection unit 20 for detecting the at least three measured values 34, 36, 38, and having two integrated interfaces 16, 18 for receiving the respective electrical signal 24, 26. The detection unit 20, the interfaces 16, 18, and the separating element 54 can be electrically coupled to one another centrally via the microcontroller 14. The microcontroller 14 can be configured to carry out the above-described method.

Presently, energy accumulators 28, in particular designed as HV energy accumulators, comprise multiple electronic components—the detection unit, the battery control unit 30, and the separating element 54—which can perform various functions. These functions can be necessary for safe operation of the electrically drivable motor vehicle 10 and/or safe switching off of the energy accumulator 28 in case of fault. The current, in particular the current strength and the insulation resistance, is measured by means of a current sensor (detection unit 20). Low requirements with respect to functional safety can be placed here, for example, a safety requirement level (Automotive Safety Integrity Level) less than or equal to level "B." Due to the low safety requirement level, the component 50, like the current measuring sensor 44 and/or the current measuring resistor 40, can be formed redundantly, for example, doubled or tripled. Furthermore, it can be necessary to combine different technologies with one another, for example Hall probes and shunts. By means of a battery controller (battery control unit 30), the ignition circuit simulation 62, i.e., a simulation of the squib can be implemented for detecting ignition signals of the airbag controller (airbag control unit 32) and thereupon opening of main contactors. Furthermore, the battery control unit 30 can be configured to measure the insulation resistance and can comprise the ignition circuit 56 for the pyrotechnic separating element 54. In addition, the battery control unit 30 can comprise high-voltage and low-voltage components combined on a circuit board, wherein a combination increases a price of the battery control unit 30, i.e., makes it more expensive. The pyrotechnic separating element 54 can be configured to disconnect the HV battery (energy accumulator 28) from a high-voltage system upon triggering. Activation of the separating element 54 can only take place via the airbag control unit 32 (airbag ECU or airbag electronic control unit) and the triggering signal 46 transmitted via an ignition line in the event of a crash, i.e., an accident. However, the separating element 54 is not ignited in the event of overcurrent.

In other concepts, for example a modular electric drive kit (or MEB) from Volkswagen© or Tesla Model 3©, a fuse can be implemented by a combination of the current sensor (detection unit 20) and the pyrotechnic separating element 54. The measured current can be monitored by the battery control unit 30 (battery SG or battery controller) and the separating element 54 is ignited via the battery control unit 30 if a current threshold is exceeded. In addition, the separating element can be ignited in the event of the accident (crash) at least partially via the ignition signal of the airbag control unit 32 (airbag SG or airbag controller). This can place high demands with respect to the functional reliability, for example, a current measurement and/or shutdown of the current requires the safety requirement level "D", which can be necessary due to an increased energy density of cells, in particular of battery cells.

A disadvantage of the prior art is that safety-critical functions of the energy accumulator 28 can be distributed to various components (detection unit 20, battery control unit 30, and separating element 54), wherein it can be necessary for the components 20, 32, 54 to communicate with one another, and for these components to be interconnected via lines (connecting element 22). This can result in an increased design effort, for example due to HV potentials, i.e. high-voltage potentials, on a circuit board, for measuring the current and/or the insulation resistance. Furthermore, a complex coordination of the various components 20, 30, 54 designed as high-voltage components with one another may be necessary and cause unintended redundancies in the system.

The invention is based on the insight of implementing the functions of the current measurement, a voltage measurement via multiple channels, for example, a battery voltage and/or an intermediate circuit voltage, the insulation resistance measurement, the ignition circuit simulation 62, and the ignition circuit 56 for a pyrotechnic separating element 54 in a common sensor safety module (device 12). This module (device 12) can communicate with the centrally formed battery control unit 30 (BMS or battery management system) of the energy accumulator 28 or other controllers, for example, the microcontroller 14 and/or the airbag control unit 32, via the vehicle bus 60, in particular the CAN bus, to transmit measured values 34, 36, 38 and/or diagnostic data, for example, the respective electrical signal 24, 26, and/or to ignite the separating element 54 in response to a received message (triggering signal 46). The separating element 54 and the sensor module (detection unit 20) can be installed here in, i.e., inside the housing 23 of the device 12. The separating element 54 and the sensor module (detection unit 20) can be arranged on a shared busbar (busbar 42), wherein the shunt for current measurement and a disconnecting point for the separating element 54 can be integrated into the busbar. The module (detection unit 20) can take over the function of the fuse together with the separating element 54, in that it measures the current and if a threshold (limiting value and/or limiting value characteristic curve), which can be parameterized and is based on hardware or software, is exceeded, it ignites the separating element 54. Furthermore, the module (device 12) can monitor the ignition line of the airbag SG (airbag control unit 32) via the ignition circuit simulation 62 and can ignite the separating element 54 if the ignition signal is detected (triggering signal 46).

This has the advantage that safety-critical functions for operating and/or shutting down the energy accumulator 28 can be unified on one component, i.e., inside the device 12, without creating a need for communication between multiple components 20, 30, 54. As a result, high requirements for the functional reliability can be implemented more easily, since a smaller number of participating components 20, 30, 54 can be implemented and there may be a lower need for communication. Furthermore, by means of a combination of the functions in one module (device 12), the operation and/or the shutdown of the energy accumulator 28 can be implemented faster and/or more flexibly, in particular in the case of safety-critical and/or time-critical functions, such as an evaluation of the respective electrical signal 24, 26 and/or the activation of the ignition circuit 56, for example, within 1-2 ms. In addition, an overcurrent threshold (limiting value and/or limiting value characteristic curve) can be adjusted flexibly, for example, by means of software, which is not possible with fuses. Furthermore, the use of materials can be reduced and/or a loss due to contact resistances can be reduced or avoided with the shared busbar (busbar 42) for the detection unit 20 and separating element 54. Alternatively or additionally, the shunt can be embodied in such a way that it comprises a weak point in the busbar (busbar 42) and thus the separating point for the separating element 54.

All functions that require special measures due to the HV potentials, for example, air and creepage distances, are unified on the circuit board, so that cost and/or installation space advantages result in comparison to an implementation on distributed circuit boards. Expenditures for implementing functional reliability, for example, hardware (component 50) having special requirements and/or complex development and/or release processes occur for only one of the components, the common device 12, so that further cost advantages result. Furthermore, the complexity of the HV system can be reduced and unintentional and/or unnecessary redundancies can be avoided.

The measurement of the current via the shunt, the measurement of the HV voltage via multiple channels, and the measurement of the insulation resistance between the respective HV potentials and a vehicle ground can be implemented here by means of the device 12. Furthermore, if the parameterizable current threshold (limiting value and/or limiting value characteristic curve) is exceeded, which is specified by the software and/or the hardware, the separating element 54 can be ignited via the ignition circuit 56 if the ignition signal (triggering signal 46) is detected. In addition, the separating element 54 can be ignited in the course of monitoring of the ignition line of the airbag SG (airbag control unit 32) and/or via the control unit 24 of the BMC (battery control unit 30). Furthermore, all relevant signals (measured values 34, 36, 38 and/or the respective electrical signal 24, 26) can be transmitted to the BMC (battery control unit 30).

All functions can be integrated into the device 12, wherein the device 12 can comprise the circuit board having electronic components (detection unit 20, communication unit 64 for the battery control unit 30, ignition circuit 56 of the separating element 54, ignition circuit simulation 62 for the airbag control unit 32) and the housing 23. The detection unit 20 can be designed as a shunt arranged on the busbar 42 (busbar). Furthermore, the device 12 has the two interfaces 16, 18 (plug-in interfaces), i.e., the high-voltage interface (HV plug-in interface) 16 and the low-voltage interface (LV plug-in interface) 18.

Overall, the examples show how the invention can provide an intelligent HV sensor system (detection unit 20) and HV pyrotechnic disconnection (separating element 54) for the EV energy accumulator (energy accumulator 28).

The invention claimed is:

1. A method for operating an electrically drivable motor vehicle, comprising:
    receiving a respective electrical signal by at least two interfaces integrated into a housing of a device, wherein a first of the at least two interfaces is designed as a high-voltage interface for an electrical energy accumulator and a second of the at least two interfaces is designed as a low-voltage interface for at least one external control unit, wherein a microcontroller is arranged in the housing, and wherein the at least one external control unit comprises an airbag control unit which comprises an ignition line;
    detecting at least three electrical measured values by a detection unit arranged inside the housing, which are correlated with a current through the detection unit, wherein the three measured values comprise: a measured value of a current strength as a first measured value, a measured value of a voltage as a second measured value, and a measured value of an insulation resistance as a third measured value;
    simulating, by the microcontroller, an ignition circuit based on signals received from the ignition line through the second of the at least two interfaces,
    determine a triggering signal for a pyrotechnic separating element by applying a triggering criterion to: the respective electrical signal, the at least three electrical measured values detected by the detecting unit, and the simulated ignition circuit;
    outputting, by the microcontroller, the triggering signal for triggering the pyrotechnic separating element when one or more of the respective electrical signal, the at least three electrical measured values, and the simulated ignition circuit meets the triggering criterion; and
    disconnecting at least one electrical connecting element by the pyrotechnic separating element due to the triggering signal, wherein the detection unit, at least the first and second interfaces, and the pyrotechnic separating element are coupled to one another centrally via the microcontroller.

2. The method as claimed in claim 1, wherein the respective electrical signal is received by the microcontroller at the second interface via a vehicle bus, and
wherein at least one of the at least three measured values and/or the triggering signal is transmitted to the at least one external control unit and/or the separating element.

3. The method as claimed in claim 1, wherein the at least one external control unit further comprises a battery control unit.

4. The method as claimed in claim 1, wherein the first measured value is determined by a current measuring sensor arranged on a busbar and/or a current measuring resistor arranged on the busbar.

5. The method as claimed in claim 1, wherein the triggering criterion is defined by at least one of a predefined limiting value and a predefined limiting value characteristic curve.

6. The method as claimed in claim 4, wherein the current measuring sensor is a Hall probe and/or the current measuring resistor is a shunt.

7. The method as claimed in claim 1, wherein the triggering signal is transmitted to an ignition circuit of the separating element integrated into the housing and then the separating element is triggered by the ignition circuit, and
wherein, upon triggering of the separating element, the at least one electrical connecting element is irreversibly disconnected by the separating element.

8. The method as claimed in claim 1, wherein the second measured value is detected by multiple electrical connecting elements, and
wherein a voltage of the electrical energy accumulator designed as a high-voltage battery is received as the second measured value.

9. The method as claimed in claim 1, wherein an insulation test of the electrical energy accumulator with respect to a vehicle body of the motor vehicle is carried out based on the third measured value.

10. A device for operating an electrically drivable motor vehicle and which is configured to carry out the method according to claim 1, the device comprising:
the housing,
the microcontroller for determining and outputting the triggering signal for the pyrotechnic separating element,
the detection unit for detecting the at least three electrical measured values, and
the at least two integrated interfaces for receiving the electrical signal.

11. The method as claimed in claim 2, wherein the triggering criterion is defined by at least one of a predefined limiting value and a predefined limiting value characteristic curve.

12. The method as claimed in claim 3, wherein the triggering criterion is defined by at least one of a predefined limiting value and a predefined limiting value characteristic curve.

13. The method as claimed in claim 1, wherein the airbag control unit is configured to transmit an ignition signal for igniting an airbag squib, and
wherein the ignition signal is received by the microcontroller through the ignition line and the second of the at least two interfaces.

14. The method as claimed in claim 1, wherein the ignition circuit simulation comprises a transistor configured to simulate a switching state of the ignition line.

* * * * *